United States Patent [19]
Oguro et al.

[11] Patent Number: 5,792,333
[45] Date of Patent: Aug. 11, 1998

[54] METHOD OF SURFACE-ROUGHENING TREATMENT OF COPPER FOIL

[75] Inventors: Ryoichi Oguro; Tadao Nakaoka; Kazuyuki Inoue; Kazuhiro Hoshino, all of Imaichi, Japan

[73] Assignee: Circuit Foil Japan Co., Ltd., Tokyo, Japan

[21] Appl. No.: 874,760

[22] Filed: Jun. 13, 1997

Related U.S. Application Data

[63] Continuation of Ser. No. 531,131, Sep. 20, 1995, abandoned.

[30] Foreign Application Priority Data

Oct. 6, 1994 [JP] Japan ........................ 6-242579
May 31, 1995 [JP] Japan ........................ 7-133279

[51] Int. Cl.$^6$ .................... C25D 5/18; C25F 3/02
[52] U.S. Cl. .................... 205/103; 205/138; 205/152; 205/215; 205/658
[58] Field of Search .................... 205/76, 77, 103, 205/138, 152, 182, 215, 658

[56] References Cited

U.S. PATENT DOCUMENTS

| | | | |
|---|---|---|---|
| 4,140,596 | 2/1979 | Wöbking | 204/108 |
| 4,434,022 | 2/1984 | Kamada et al. | 156/274.6 |
| 4,568,431 | 2/1986 | Polan et al. | 204/13 |
| 4,652,346 | 3/1987 | Polan | 204/15 |
| 5,454,926 | 10/1995 | Clouser et al. | 205/50 |

FOREIGN PATENT DOCUMENTS

| | | |
|---|---|---|
| 0 099 086 | 1/1984 | European Pat. Off. . |
| 112 145 | 3/1975 | Germany . |
| 61-54592 | 11/1996 | Japan . |
| 2 116 213 | 9/1983 | United Kingdom . |

*Primary Examiner*—Kathryn L. Gorgos
*Assistant Examiner*—William T. Leader
*Attorney, Agent, or Firm*—Frishauf, Holtz, Goodman, Langer & Chick, P.C.

[57] ABSTRACT

A method of surface-roughening a copper foil by subjecting at least one side of the copper foil to electro-plating using an alternating current, wherein a sulfuric acid bath or a sulfuric acid-copper sulfate bath is used as an electrolyte.

21 Claims, 2 Drawing Sheets

5,792,333

1

METHOD OF SURFACE-ROUGHENING TREATMENT OF COPPER FOIL

This application is a Continuation of application Ser. No. 08/531,131, filed Sep. 20, 1995, now abandoned.

BACKGROUND OF THE INVENTION

This invention relates to a method of surface-roughening treatment of a copper foil used for a printed wiring board or the like.

As a copper foil used for a printed wiring board, there has generally been used, for example, a one side-roughened or both side-roughened electrodeposited copper foil or rolled copper foil having a thickness of 18 to 70 μm. In recent years, as a circuit has a finer pattern, it is demanded to make the copper foil to be used thin, and there is demanded a roughened copper foil in which a surface shape after roughening treatment is smooth macroscopically and an anchoring effect on a prepreg is strong.

As to making a copper foil thin, for example, in the case of an electrodeposited copper foil, it has already been possible to produce a foil having a thickness (a thickness calculated on a unit weight) of about 9 μm. As a technique of roughening treatment of a matte side of a copper foil obtained, there should be used a combination of a step of nodule-attaching treatment by cathode electro-plating treatment and a step of smooth plating for preventing dropping of nodules formed in the above step.

In the above roughening treatment, even though a copper foil is made thin in a raw foil production stage, the copper foil may have a maximum thickness of 18 μm because of roughness of nodules formed in a roughening stage which is carried out after the raw foil production stage. Therefore, there is a drawback that a technique of producing a thin copper foil cannot be utilized sufficiently depending on a technique of roughening treatment to be used in combination.

Also, a technique of lowering surface roughness of a matte side in a raw foil production stage (low profiling) has progressed. There has been attempted improvement in a raw foil production stage so that said surface roughness can be maintained low even when roughening treatment is carried out. However, slight reduction in surface roughness can be observed when a conventional roughening treatment technique by cathode electro-plating treatment is used, but such reduction is not sufficient. Under the existing circumstances, a satisfactory surface shape after roughening treatment has not been obtained.

On the other hand, as a roughening treatment technique, for example, with respect to a copper foil, particularly an electrodeposited copper foil for a printed wiring board, there has been known a method in which the so-called nodular plating of copper which is easily dropped with a current condition approximate to a limiting current density is generally applied by using a sulfuric acid-copper sulfate bath as a first stage. After such first stage, a second stage involving smooth plating is carried out for the purpose of allowing copper nodules which are easily dropped to have a desired shape and to be arranged uniformly and which further prevents dropping of the copper nodules.

However, both of the stages of said above method are cathode electro-plating treatments using a direct current. In many cases, a surface shape after the roughening treatment reflects a shape of a raw foil. On the other hand, in the case of a rolled foil, since a surface to be treated is smooth, formed nodules are arranged relatively uniformly, but an

2 anchoring effect is insufficient, whereby characteristics required as a copper foil for a printed wiring board cannot be satisfied.

Further, in the case of a copper foil having an ordinary matte side produced by electro-plating, a shape of formed nodules may be made dendritic, which is undesirable because not only does the surface roughness becomes large, but also a remainder of copper (remaining copper particles) may occur in an etching step after a lamination step.

On the other hand, when a roughening treatment is carried out so that a shape of formed nodules are not made dendritic, an anchoring effect becomes insufficient, whereby characteristics required as a copper foil for a printed wiring board cannot be satisfied.

Further, even when a roughening treatment is applied to a surface of a low-profiled electrodeposited copper foil, there is observed a tendency which is substantially the same as in the case of applying a roughening treatment to a rolled foil.

With respect to a nickel foil and an iron foil, substantially the same tendency as described above is observed.

As a new method of surface-roughening treatment, there has been proposed a method in which by using a hydrochloric acid, sulfuric acid or nitric acid bath as an electrolyte, a surface of a rolled copper foil (35 μm) is electrochemically etched using a direct current or an alternating current to form a large number of fine holes having a maximum depth of 10 μm and a minimum depth of 0.5 μm (Japanese Patent Publication No. 54592/1986). However, in this method, the surface of the copper foil is merely roughened by etching, so that characteristics recently required as a copper foil for a printed wiring board cannot be satisfied.

Further, in a conventional manufacture of a copper foil for a printed wiring board, immediately after raw foil production, both of an electrodeposited copper foil and a rolled copper foil are generally wound once in a coil state and then subjected to surface treatments such as surface roughening treatment and stainproofing in a different processor. In the case of a thin copper foil having a thickness of about 9 to 12 μm, during a period from a roughening treatment step to a stainproofing step, factors for failures such as wrinkle and scratch are generated, whereby productivity is extremely lowered.

As a means for improving productivity, there has been proposed a method in which an electrodeposited copper foil is roughened in a raw foil production stage and surface treatments including stainproofing is carried out continuously in a step immediate before said foil is wound in a coil state. However, when raw foil production and roughening treatment are carried out in the same bath, not only an electrolyte is contaminated by dropped nodules, but also the quality of a produced copper raw foil itself is lowered undesirably. On the other hand, there has been roposed a means in which an electrolyte to be used for raw foil production and an electrolyte to be used for roughenng treatment are provided separately in one raw foil producing apparatus. However, in the above means, a structure of the raw foil producing apparatus is made complicated, which is not practical.

SUMMARY OF THE INVENTION

An object of the present invention is to provide a copper foil having an excellent anchoring effect without greatly changing a surface state of a copper foil which is made thin or a copper foil which is low-profiled before and after roughening treatment, and further to provide a method in which a manufacturing step of a thin electrodeposited copper foil is simplified and also yield is improved.

The present invention relates to a method of surface-roughening treatment of a copper foil by subjecting at least one side of the copper foil to electro-plating treatment using an alternating current, wherein a sulfuric acid bath or a sulfuric acid-copper sulfate bath is used as an electrolyte.

DESCRIPTION OF THE PREFERRED EMBODIMENTS

Figure 1:
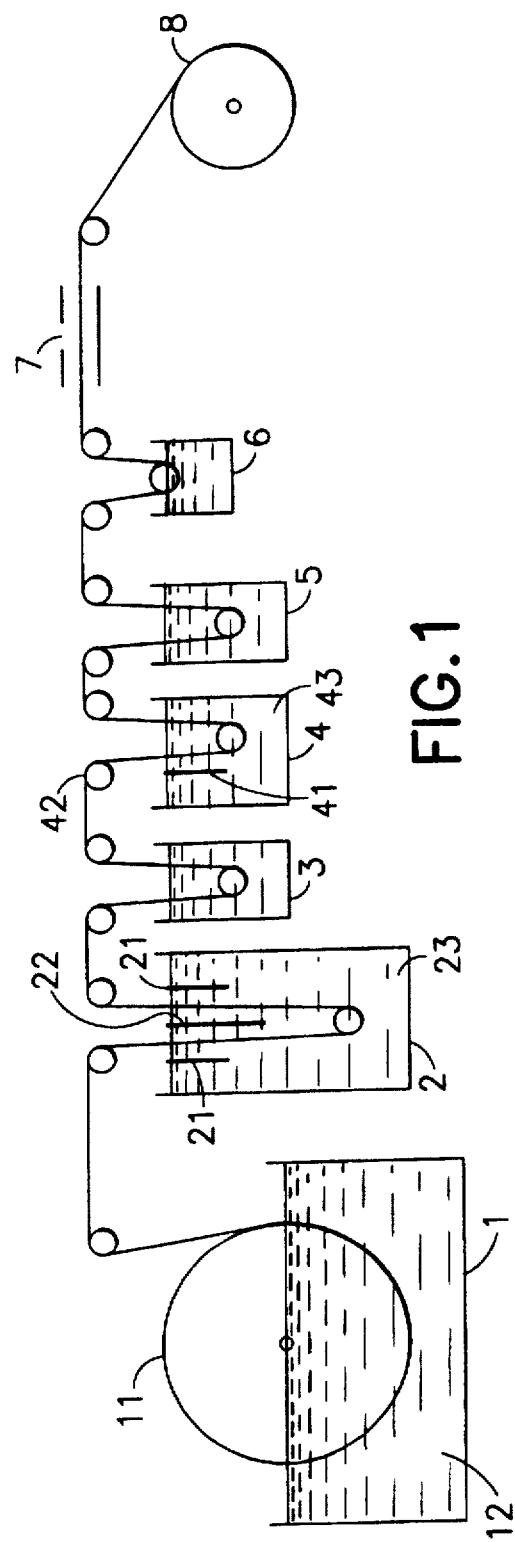
FIG. 1 is a schematic view showing steps of the manufacturing method (an electrodeposited copper foil, continuous treatment) of the present invention.

The method of surface-roughening treatment of the present invention is an electro-plating treatment using an alternating current, and a sulfuric acid bath or a sulfuric acid-copper sulfate bath is used as an electrolyte. Therefore, a surface of a copper foil to be subjected to roughening treatment necessarily receives an etching action (anodic dissolution) and a copper nodule-attaching action (cathodic electrodeposition) alternately. As a result, attached copper nodules have a shape which is extremely sound and are hardly dropped. Therefore, the copper foil to be subjected to roughening treatment may be an electrodeposited copper foil or a rolled copper foil. Particularly in the case of an electrodeposited copper foil having a thickness of 9 to 12 μm, since a raw foil producing rate can be made coincident with a treating rate required for surface roughening treatment by alternating current electro-plating, treatments such as raw foil production, surface roughening, stainproofing and the like can be carried out continuously without once winding a raw copper foil produced around a roll.

As the electricity feeding method of the present invention, it is possible to employ either a system in which an alternating current electro-plating treatment with a direct electricity feeding is carried out by using a copper foil itself as an electrode and an insoluble electrode such as carbon graphite as a counter electrode, or a system in which an alternating current electro-plating treatment with an indirect electricity feeding is carried out by making a copper foil run between insoluble electrodes by using the bipolar phenomenon. However, an indirect electricity feeding system using the bipolar phenomenon is preferred since there is no loss due to contact resistance of an electricity feeding roller and a copper foil and no loss due to resistance of the copper foil itself from an electricity feeding portion to an electrolyte; it can be avoided to change characteristics of the copper foil due to heat generated by resistance of the copper foil; and there is no damage of a copper foil surface caused by sparks generated between a contact roll and the copper foil.

Therefore, when the indirect electricity feeding system using the bipolar phenomenon is employed as an electricity feeding method and further treatments from raw foil production to stainproofing are carried out continuously, a copper foil for a printed wiring board, which is made thin as demanded recently and also low-profiled, can be manufactured while maintaining high productivity and yield.

In the present invention, a preferred sulfuric acid concentration of the sulfuric acid bath to be used as an electrolyte is 30 to 200 g/l, and preferred sulfuric acid concentration and copper sulfate concentration of the sulfuric acid-copper sulfate bath are 30 to 200 g/l and 80 g/l or less (as $CuSO_4 \cdot 5H_2O$), respectively. Here, if the sulfuric acid concentration is less than 30 g/l, there is observed a tendency that electrodeposition of nodulous electrodeposited substances, which makes a surface roughening degree conspicuous, becomes worse significantly; and solution resistance of the electrolyte becomes large to cause an increase in voltage. Even if the sulfuric acid concentration is 200 g/l or less, the object of the present invention can be achieved sufficiently, so that from an economical point of view, it is not necessary that the sulfuric acid concentration exceeds 200 g/l. On the other hand, if the copper sulfate concentration exceeds 80 g/l, a limiting current density of a copper concentration is exceeded, so that nodulous electrodeposited substances are smoothened, whereby it is impossible to obtain a nodule shape which is sound and has an excellent anchoring effect.

The bath temperature is not particularly limited. However, when the sulfuric acid bath is used, the temperature is preferably in the range of room temperature to 80° C. On the other hand, when the sulfuric acid-copper sulfate bath is used, it is preferred to set the bath temperature in the range of 40° to 60° C. in order to prevent deposition of copper crystals and carry out roughening treatment effectively.

Further, it is observed that the resulting nodule shape is slightly different depending on whether an additive is added to the electrolyte or not. When the additive is not added, the respective shapes of nodulous electrodeposited substances formed have a slightly "coarse" appearance. However, when a small amount of the additive is added, "coarseness" tends to disappear. Therefore, in the point of making the respective shapes of the formed nodulous electrodeposited substances more preferred shapes, it is preferred to add the additive. However, even when the additive is not added, adhesion required for practical use can be obtained.

When an additive is added, it is preferred to add at least one additive selected from the group consisting of inorganic compound type additives and organic compound type additives.

As the inorganic compound type additive, there may be mentioned an arsenic compound, a molybdenum compound, a vanadium compound, a cobalt compound, a magnesium compound, an indium compound, a tungsten compound and so forth. As the organic compound type additive, there may be mentioned potassium antimonyl tartrate, gum arabic, hydroxyethyl cellulose, animal glue, thiourea and so forth.

When the additive is added, a concentration thereof is not particularly limited, it is sufficient that the concentration is from a minute amount exceeding 0 ppm as a lower limit to 300 ppm as an upper limit. Even when a extremely minute amount of the additive is used, an effect of changing the shapes of the nodulous electrodeposited substances may be exhibited depending on the kind of the additive, but, in most of the additives, the above effect reaches the top at a concentration of about 300 ppm. Even when a plurality of the additives are added, it is sufficient from the same reason described above that the total concentration of the additives is in the range of a minute amount exceeding 0 ppm to 300 ppm. In the case of the alternating current electro-plating treatment, even when a large amount of the additive is added, a remarkable difference in electro-plating does not appear and the effect is exhibited only on the shapes of the nodulous electrodeposited substances, so that an economical addition range may be suitably set depending on the kind of the additive to be added.

As an electrode material for the surface-roughening treatment by using an alternating current electro-plating, carbon graphite is preferably used in the point that such material itself is not dissolved. If there is another economically preferred insoluble material, such a material may be used.

With respect to current conditions of the surface-roughening treatment, when roughening is to be completed by one stage alternating current electro-plating treatment, there may be set a current density which is intermediate between a limiting current density and a current density at which effective smooth plating can be effected, calculated on an effective current. The current density at the time of the alternating current electro-plating treatment in the present invention is preferably in the range of 10 to 50 A/dm$^2$ when the sulfuric acid bath is used and in the range of 30 to 80 A/dm$^2$ when the sulfuric acid-copper sulfate bath is used. Further, the treatment time varies depending on the current density used, but it is preferably in the range of 15 to 180 seconds in both of the case of using the sulfuric acid bath and the case of using the sulfuric acid-copper sulfate bath. However, the suitable current conditions and treatment time vary depending on the bath temperature, presence of the additive and conditions of a bath composition, so that the suitable current conditions and treatment time are not limited to the above ranges.

When the surface-roughening treatment is to be completed by two stages, it is preferred that the copper foil subjected to the surface-roughening treatment in the first stage is subjected to the so-called capsule plating by using the sulfuric acid-copper sulfate bath (preferred sulfuric acid concentration: 30 to 200 g/l, preferred copper sulfate concentration: 150 to 350 g/l as CuSO$_4$·5H$_2$O) in order to prevent dropping of the nodulous electrodeposited substances from said foil and maintain sound nodulous shapes. In this case, the electro-plating treatment may be a cathode electro-plating treatment; the current density is preferably in the range of about 10 to 30 A/dm$^2$; the treatment time is in the range of 10 to 50 seconds although it varies depending on the current density used; and the bath is preferably a warm bath (preferred bath temperature: 35° to 55° C.), which is not limitative.

As described above, it is preferred that the copper foil subjected to the surface-roughening treatment is further subjected to stainproofing by an organic stainproofing agent or chromate coating in order to impart corrosion resistance to said copper foil.

Referring to FIG. 1, 1 is a drum type raw foil producing apparatus; 11 is a raw foil producing drum; 12 is an electrolyte; 2 is a roughening treatment tank; 21 is a carbon electrode; 22 is a shielding plate (a non-electric conductor); 23 is an electrolyte; 3 is a rinsing tank; 4 is a plating treatment tank; 41 is an iridium oxide electrode; 42 is a contact roll; 43 is an electrolyte; 5 is a rinsing tank; 6 is a stainproofing tank; 7 is a drying apparatus; and 8 is a winding portion.

EXAMPLES

The present invention is described in detail by referring to Examples.

EXAMPLE 1

As shown in FIG. 1, an electrodeposited raw copper foil having a nominal thickness of 9 µm produced by a known manufacturing method was introduced into a roughening treatment tank 2 in which carbon electrodes 21 were arranged opposite to each other, without once winding the copper foil in a coil state (hereinafter, the above introduction method is called "continuous method"). Under the following bath composition and indirect alternating current electroplating conditions, a matte side of the copper foil was subjected to surface-roughening treatment (a shielding plate 22 was arranged between the carbon electrodes 21, and the copper foil was passed between the carbon electrodes 21 and the shielding plate 22).

Bath composition—sulfuric acid: 100 g/l, arsenious acid as an additive: 200 ppm as As Electro-plating conditions—bath temperature: 40° C., commercial alternating current electroplating current density: 25 A/dm$^2$, treatment time: 25 seconds Thereafter, the copper foil subjected to surface-roughening treatment was introduced into a rinsing tank 3 to wash the surface of the copper foil with water sufficiently, and then the copper foil was introduced into a plating treatment tank 4. In the plating treatment tank 4, the copper foil was subjected to smooth plating (capsule plating) treatment by using an iridium oxide electrode 41 as a counter electrode and under the following bath composition and cathode electro-plating conditions, for the purpose of preventing falling of nodulous electrodeposited substances at the matte side of the copper foil.

Bath composition—sulfuric acid: 110 g/l, copper sulfate: 250 g/l

Electro-plating conditions—bath temperature: 50° C., cathode electro-plating current density: 20 A/dm$^2$, treatment time: 15 seconds Thereafter, the copper foil subjected to capsule plating was introduced into a rinsing tank 5 to wash the surface of the copper foil with water sufficiently, and then the copper foil was introduced into a stainproofing tank 6. In the stainproofing tank 6, the surface of the copper foil was subjected to chromate coating by dipping and passing the copper foil in an aqueous solution containing 3.0 g/l of chromium trioxide at ordinary temperature. After the copper foil is passed through a drying apparatus 7, the copper foil was continuously wound by a winding portion 8.

The resulting copper foil was evaluated with respect to the following items.

The results are shown in Table 1.

(1) Uniformity of nodule shapes

The shapes of fine dissolved and reattached copper particles of the roughened surface were observed by a scanning electron microscope. The case where the sizes of the respective reattached copper particles were uniform and regular was shown by ⊚; the case where the sizes of the particles were substantially uniform was shown by O; the case where the sizes of the particles were somewhat uniform was shown by Δ; and the case where the sizes of the particles were not uniform was shown by X. Further, the case where any dissolved and reattached copper particle was not observed and only a shape of a dissolved side was observed was shown by ■.

(2) Degree of peeling strength (anchoring effect) after lamination of glass epoxy prepreg After the roughened surface of the copper foil was superposed on seven superposed glass epoxy prepregs, the copper foil and the prepregs were sandwiched between press plates and subjected to heat and pressure molding at 170° C. for 90 minutes. With respect to the resulting copper-clad laminate, peeling strength was measured according to JIS C 6481.

(3) Degree of remaining copper particle (transfer) on laminate

The surface of a glass base material, peeling strength of which was measured, was observed by an optical microscope to measure the number of remaining copper particles per unit area (0.5 mm×0.5 mm). The case where no remaining copper particle was observed was shown by ⊚; the case where almost no remaining copper particle was observed was shown by O; the case where some remaining copper particles were observed was shown by Δ; and the case where significantly many remaining copper particles were observed was shown by X.

(4) Measurement of surface roughness

Before and after surface-roughening treatment, the surface roughness "Rz" of the copper foil was measured according to JIS B 0601.

(5) Comparison of time from electrodeposited raw foil production to completion of stainproofing A time required for conventional steps were measured and shown as an index with a time required for steps until the one side-roughened copper foil shown in Example 1 was obtained being 100.

EXAMPLE 2

Procedures were carried out in the same manner as in Example 1 except for using an electrodeposited copper foil (which was low-profiled) having a nominal thickness of 9 μm introduced according to the continuous method as a copper foil to be subjected to roughening treatment.

The resulting copper foil was evaluated with respect to the same items as in Example 1. The results are shown in Table 1.

EXAMPLE 3

Figure 2:
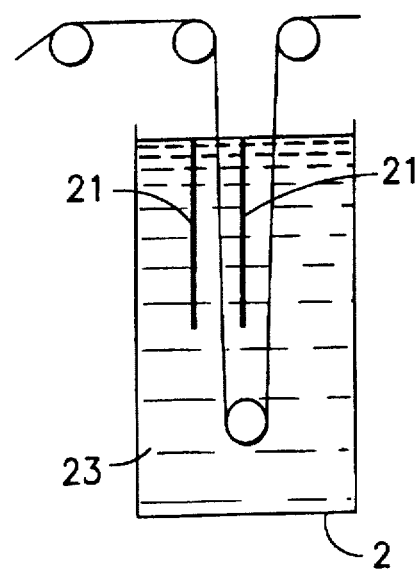
FIG. 2 is a schematic view showing one embodiment of an electrode arrangement in a roughening treatment tank, wherein the reference numerals have the same meanings as described hereinbelow for FIG. 1.
Figure 3:
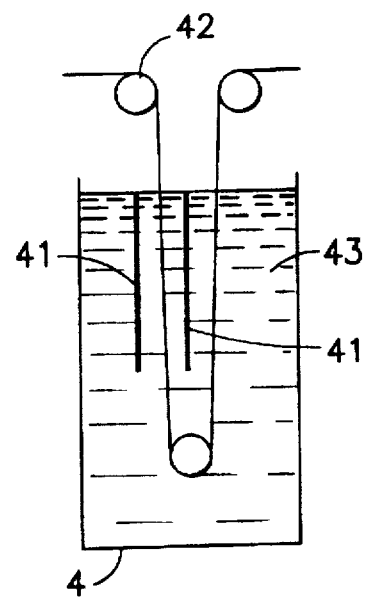
FIG. 3 is a schematic view showing one embodiment of electrode arrangement in a plating treatment tank, wherein the reference numerals have the same meanings as described hereinbelow for FIG. 1.

Procedures were carried out in the same manner as in Example 2 except for subjecting both sides of the copper foil to roughening treatment by using the embodiment shown in FIG. 2 (using no shielding plate 22) and subjecting both sides of the copper foil to smooth plating treatment by using the embodiment shown in FIG. 3 (iridium oxide electrodes 41 were arranged opposed to each other).

The resulting copper foil was evaluated with respect to the same items as in Example 1. The results are shown in Table 1.

EXAMPLE 4

Procedures were carried out in the same manner as in Example 3 except for using a rolled raw copper foil having a nominal thickness of 9 μm produced by a known manufacturing method and wound in a coil state as a copper foil to be subjected to roughening treatment.

The resulting copper foil was evaluated with respect to the same items as in Example 1. The results are shown in Table 1.

EXAMPLE 5

Procedures were carried out in the same manner as in Example 2 except for changing the bath composition of roughening treatment to 100 g/l of sulfuric acid and 80 g/l of copper sulfate, using 200 ppm as As of arsenious acid as an additive, changing the commercial alternating current electro-plating density to 30 A/dm$^2$ as an indirect alternating current electro-plating condition and carrying out no smooth plating treatment.

The resulting copper foil was evaluated with respect to the same items as in Example 1. The results are shown in Table 1.

EXAMPLE 6

Procedures were carried out in the same manner as in Example 4 except for changing the bath composition of roughening treatment to 100 g/l of sulfuric acid and 80 g/l of copper sulfate, using 200 ppm as As of arsenious acid as an additive, changing the commercial alternating current electroplating density to 30 A/dm$^2$ as an indirect alternating current electro-plating condition and carrying out no smooth plating treatment.

The resulting copper foil was evaluated with respect to the same items as in Example 1. The results are shown in Table 1.

EXAMPLE 7

Procedures were carried out in the same manner as in Example 5 except for using an electrodeposited raw copper foil (which was low-profiled) having a nominal thickness of 18 μm produced by a known manufacturing method and wound in a coil state as a copper foil to be subjected to roughening treatment and adding no additive to the bath for roughening treatment.

The resulting copper foil was evaluated with respect to the same items as in Example 1. The results are shown in Table 1.

EXAMPLE 8

Procedures were carried out in the same manner as in Example 4 except for using a rolled raw copper foil having a nominal thickness of 18 μm produced by a known manufacturing method and wound in a coil state as a copper foil to be subjected to roughening treatment.

The resulting copper foil was evaluated with respect to the same items as in Example 1. The results are shown in Table 1.

Comparative Example 1

By arranging a matte side of an electrodeposited raw copper foil having a nominal thickness of 9 μm produced by a known manufacturing method and wound in a coil state as a cathode and arranging an iridium oxide-coated titanium plate as a counter anode, fine nodular copper particles were formed by attachment under the following bath composition and cathode electro-plating treatment conditions.

Bath composition—sulfuric acid: 110 g/l, copper sulfate: 100 g/l, arsenious acid as an additive: 200 ppm as As Electro-plating conditions—bath temperature: 28° C., cathode electro-plating current density: 30 A/dm$^2$, treatment time: 5.5 seconds Further, in order to strongly fix the fine nodular copper particles, smooth plating treatment and chromate coating were carried out in the same manner as described in Example 1.

The resulting copper foil was evaluated with respect to the same items as in Example 1. The results are shown in Table 1.

Comparative Example 2

Procedures were carried out in the same manner as in Comparative example 1 except for using an electrodeposited raw copper foil (which was low-profiled) having a nominal thickness of 9 μm produced by a known manufacturing method and wound in a coil state as a copper foil to be subjected to roughening treatment.

The resulting copper foil was evaluated with respect to the same items as in Example 1. The results are shown in Table 1.

Comparative Example 3

Procedures were carried out in the same manner as in Example 4 except for changing the bath of roughening treatment to a hydrochloric acid bath (hydrochloric acid: 100 g/l, arsenious acid as an additive: 200 ppm as As).

The resulting copper foil was evaluated with respect to the same items as in Example 1. The results are shown in Table 1.

Comparative Example 4

Procedures were carried out in the same manner as in Example 4 except for changing the bath of roughening treatment to a nitric acid bath (nitric acid: 100 g/l, arsenious acid as an additive: 200 ppm as As).

The resulting copper foil was evaluated with respect to the same items as in Example 1. The results are shown in Table 1.

Comparative Example 5

Procedures were carried out in the same manner as in Comparative example 2 except for carrying out no smooth plating treatment.

The resulting copper foil was evaluated with respect to the same items as in Example 1. The results are shown in Table 1.

Comparative Example 6

Procedures were carried out in the same manner as in Comparative example 1 except for using a rolled raw copper foil having a nominal thickness of 9 μm produced by a known manufacturing method and wound in a coil state as a copper foil to be subjected to roughening treatment, subjecting both sides of the copper foil to roughening treatment by using the embodiment shown in FIG. 2 (using no shielding plate 22) and carrying out no smooth plating treatment.

The resulting copper foil was evaluated with respect to the same items as in Example 1. The results are shown in Table 1.

Comparative Example 7

Procedures were carried out in the same manner as in Example 7 except for changing 100 g/l of sulfuric acid in the bath composition of roughening treatment to 100 g/l of hydrochloric acid.

The resulting copper foil was evaluated with respect to the same items as in Example 1. The results are shown in Table 1.

Comparative Example 8

Procedures were carried out in the same manner as in Example 7 except for changing 100 g/l of sulfuric acid in the bath composition of roughening treatment to 100 g/l of nitric acid.

The resulting copper foil was evaluated with respect to the same items as in Example 1. The results are shown in Table 1.

Comparative Example 9

Procedures were carried out in the same manner as in Example 8 except for changing the bath of roughening treatment to a hydrochloric acid bath (hydrochloric acid: 100 g/l, arsenious acid as an additive: 200 ppm as As).

The resulting copper foil was evaluated with respect to the same items as in Example 1. The results are shown in Table 1.

Comparative Example 10

Procedures were carried out in the same manner as in Example 8 except for changing the bath of roughening treatment to a nitric acid bath (nitric acid: 100 g/l, arsenious acid as an additive: 200 ppm as As).

The resulting copper foil was evaluated with respect to the same items as in Example 1. The results are shown in Table 1.

TABLE 1

| | Uniformity of shape of roughened attached nodules | | Peeling strength (kgf/cm) | | Degree of remaining copper particle | | Surface roughness Rz (μm) | | | | Time from electrodeposited raw foil production to completion of stainproofing (index value) |
|---|---|---|---|---|---|---|---|---|---|---|---|
| | | | | | | | Before roughening | | After roughening | | |
| | Shiny side | Matte side | Shiny side | Matte side | Shiny side | Matte side | Shiny side | Matte side | Shiny side | Matte side | |
| Example 1 | — | ◎ | — | 0.85 | — | ◎ | — | 3.5 | — | 4.0 | 100 |
| Example 2 | — | ◎ | — | 0.76 | — | ◎ | — | 2.6 | — | 3.1 | 100 |
| Example 3 | ◎ | ◎ | 0.58 | 0.76 | ◎ | ◎ | 1.8 | 2.6 | 2.8 | 3.1 | 100 |
| Example 4 | ◎ | ◎ | 0.61 | 0.63 | ◎ | ◎ | 0.6 | 0.6 | 0.7 | 0.7 | — |
| Example 5 | — | ○ | — | 0.68 | — | Δ | — | 2.6 | — | 4.3 | 100 |
| Example 6 | ○ | ○ | 0.54 | 0.54 | ○ | ○ | 0.6 | 0.6 | 1.5 | 1.5 | — |
| Example 7 | — | ○ | — | 1.05 | — | Δ | — | 3.4 | — | 4.2 | 275 |
| Example 8 | ◎ | ◎ | 0.66 | 0.69 | ◎ | ◎ | 0.6 | 0.6 | 0.7 | 0.7 | — |
| Comparative example 1 | — | Δ | — | 1.08 | — | X | — | 3.5 | — | 5.6 | 175 |
| Comparative example 2 | — | ○ | — | 0.98 | — | ○ | — | 2.6 | — | 4.1 | 175 |
| Comparative example 3 | ■ | ■ | 0.38 | 0.40 | ◎ | ◎ | 0.6 | 0.6 | 0.9 | 1.0 | — |
| Comparative example 4 | ■ | ■ | 0.29 | 0.28 | ◎ | ◎ | 0.6 | 0.6 | 0.8 | 0.8 | — |

TABLE 1-continued

| | Uniformity of shape of roughened attached nodules | | Peeling strength (kgf/cm) | | Degree of remaining copper particle | | Surface roughness Rz (μm) | | | | Time from electro-deposited raw foil production to completion of stainproofing (index value) |
|---|---|---|---|---|---|---|---|---|---|---|---|
| | | | | | | | Before roughening | | After roughening | | |
| | Shiny side | Matte side | Shiny side | Matte side | Shiny side | Matte side | Shiny side | Matte side | Shiny side | Matte side | |
| Comparative example 5 | — | X | — | 0.77 | — | X | — | 2.6 | — | 4.8 | 175 |
| Comparative example 6 | Δ | Δ | 0.65 | 0.68 | Δ | Δ | 0.6 | 0.6 | 2.4 | 2.4 | — |
| Comparative example 7 | — | ■ | — | 0.74 | — | ⊙ | — | 3.4 | — | 4.7 | 275 |
| Comparative example 8 | — | ■ | — | 0.95 | — | ⊙ | — | 3.4 | — | 4.6 | 275 |
| Comparative example 9 | ■ | ■ | 0.44 | 0.42 | ⊙ | ⊙ | 0.6 | 0.6 | 0.9 | 1.0 | — |
| Comparative example 10 | ■ | ■ | 0.36 | 0.35 | ⊙ | ⊙ | 0.6 | 0.6 | 0.8 | 0.8 | — |

Note) In the case of a rolled copper foil, an upper side of the rolled copper foil taken out from a roll was used as a shiny side.

According to the treatment method of the present invention, raw foil production, roughening treatment and stainproofing are carried out in series, so that only one winding operation of a copper foil is required, the number of times the copper foil pass through a metal roll is small and steps are simplified, whereby productivity and yield can be improved simultaneously.

Further, as shown in Table 1, with respect to the characteristics, the anchoring effect is slightly lowered, but uniformity of attached nodules is excellent and also surface roughness after roughening treatment can be controlled to be low, so that there is no fear of dropping of attached nodules, which leads to improvement in quality of a copper foil for a printed wiring board, which is made thin or low-profiled.

We claim:

1. A method of surface-roughening a copper foil comprising subjecting at least one side of the copper foil to a repeated sequence of anodic dissolution to etch the copper foil and cathodic electrodeposition to attach copper nodules to the copper foil by electroplating, the electroplating comprising applying an alternating current to the copper foil in an electrolyte consisting essentially of sulfuric acid in a concentration of 30 to 200 g/l, the electroplating being carried out at a temperature of room temperature to 80° C., with a current density of 30 to 80 A/dm² and for a time of 15 to 180 seconds.

2. The method according to claim 1, wherein the surface-roughening is carried out by an indirect electricity feeding method.

3. The method according to claim 2, wherein the electrolyte is a bath to which at least one additive selected from the group consisting of inorganic compound additives and organic compound additives.

4. The method according to claim 3, wherein after the surface-roughening, a stainproofing is carried out with an organic stainproofing agent or a chromate coating.

5. The method according to claim 3, wherein after the surface-roughening, a smooth plating treatment is carried out by using a sulfuric acid-copper sulfate bath.

6. The method according to claim 5, wherein after the smooth plating, a stainproofing is carried out with an organic stainproofing agent or a chromate coating.

7. The method according to claim 6, wherein the copper foil is an electrodeposited copper foil, and until the stainproofing, the electrodeposited copper foil is not wound around a roll.

8. The method according to claim 2, wherein after the surface-roughening, a smooth plating treatment is carried out with a sulfuric acid-copper sulfate bath.

9. The method according to claim 8, wherein after the smooth plating, a stainproofing is carried out with an organic stainproofing agent or a chromate coating.

10. The method according to claim 9, wherein the copper foil is an electrodeposited copper foil, and until the stainproofing, the electrodeposited copper foil is not wound around a roll.

11. The method according to claim 2, wherein after the surface-roughening, a stainproofing is carried out with an organic stainproofing agent or a chromate coating.

12. The method according to claim 1, wherein the electrolyte is a bath to which is added at least one additive selected from the group consisting of inorganic compound additives and organic compound additives.

13. The method according to claim 12, wherein after the surface-roughening, a stainproofing is carried out with an organic stainproofing agent or a chromate coating.

14. The method according to claim 12, wherein after the surface-roughening, a smooth plating treatment is carried out with a sulfuric acid-copper sulfate bath.

15. The method according to claim 14, wherein after the smooth plating, a stainproofing is carried out with an organic stainproofing agent or a chromate coating.

16. The method according to claim 15, wherein the copper foil is an electrodeposited copper foil, and until the stainproofing, the electrodeposited copper foil is not wound around a roll.

17. The method according to claim 1, wherein after the surface-roughening, a smooth plating treatment is carried out with sulfuric acid-copper sulfate bath.

18. The method according to claim 17, wherein after the smooth plating treatment, a stainproofing is carried out with an organic stainproofing agent or a chromate coating.

19. The method according to claim 18, wherein the copper foil is an electrodeposited copper foil, and until the stainproofing, the copper electrodeposited foil is not wound around a roll.

20. The method according to claim 1, wherein after the surface-roughening, a stainproofing is carried out with an organic stainproofing agent or a chromate coating.

21. The method according to claim 1, wherein the foil to be surface-roughened is an electrodeposited copper foil having a thickness 9 to 12 μm.

* * * * *